United States Patent
Liu et al.

(10) Patent No.: US 12,550,640 B2
(45) Date of Patent: Feb. 10, 2026

(54) METHOD OF PROCESSING SUBSTRATE, SUBSTRATE PROCESSING APPARATUS, METHOD OF MANUFACTURING SEMICONDUCTOR DEVICE, AND RECORDING MEDIUM

(71) Applicant: Kokusai Electric Corporation, Tokyo (JP)

(72) Inventors: Tao Liu, Toyama (JP); Kazuhiro Harada, Toyama (JP); Tomoki Imamura, Toyama (JP); Kazuyuki Okuda, Toyama (JP); Takaaki Noda, Toyama (JP)

(73) Assignee: Kokusai Electric Corporation, Tokyo (JP)

( * ) Notice: Subject to any disclaimer, the term of this patent is extended or adjusted under 35 U.S.C. 154(b) by 605 days.

(21) Appl. No.: 17/950,481

(22) Filed: Sep. 22, 2022

(65) Prior Publication Data
US 2023/0101063 A1 Mar. 30, 2023

(30) Foreign Application Priority Data
Sep. 28, 2021 (JP) .................. 2021-157805

(51) Int. Cl.
*H01L 21/02* (2006.01)
*C23C 16/36* (2006.01)
(Continued)

(52) U.S. Cl.
CPC .......... *H01L 21/0228* (2013.01); *C23C 16/36* (2013.01); *C23C 16/4412* (2013.01); *C23C 16/50* (2013.01); *H01L 21/02126* (2013.01)

(58) Field of Classification Search
CPC .......... H01L 21/0228; H01L 21/02126; H01L 21/02211; H01L 21/02274;
(Continued)

(56) References Cited

U.S. PATENT DOCUMENTS 9,263,253 B2 * 2/2016 Sasajima ........... C23C 16/45544
9,508,543 B2 11/2016 Orihashi et al.
(Continued)

FOREIGN PATENT DOCUMENTS

CN 106463395 B 6/2019
JP 2013-140944 A 7/2013
(Continued)

OTHER PUBLICATIONS

Office Action issued on Jun. 4, 2024 for Taiwan Patent Application No. 111126865.
(Continued)

*Primary Examiner* — Dale E Page
*Assistant Examiner* — Quovaunda Jefferson
(74) *Attorney, Agent, or Firm* — Volpe Koenig

(57) ABSTRACT

There is provided a technique that includes: (a) supplying a first gas containing a predetermined element to the substrate; (b) supplying a second gas containing carbon and nitrogen to the substrate; (c) supplying a nitrogen-containing gas activated by plasma to the substrate; (d) supplying an oxygen-containing gas to the substrate; and (e) forming a film containing at least the predetermined element, oxygen, carbon, and nitrogen on the substrate by: performing a cycle a first number of times of two or more, the cycle performing (a) to (d); or performing a cycle once or more, the cycle performing (a) to (d) in this order.

20 Claims, 9 Drawing Sheets

(51) Int. Cl.
*C23C 16/44* (2006.01)
*C23C 16/50* (2006.01)

(58) Field of Classification Search
CPC ... H01L 21/02186; C23C 16/30; C23C 16/36; C23C 16/308; C23C 16/4412; C23C 16/45531; C23C 16/45542; C23C 16/45553; C23C 16/45527; C23C 16/4554; C23C 16/50; C23C 16/505; C23C 16/52
See application file for complete search history.

(56) References Cited

U.S. PATENT DOCUMENTS

| | | | |
|---|---|---|---|
| 2013/0149873 | A1 | 6/2013 | Hirose et al. |
| 2013/0149874 | A1 | 6/2013 | Hirose et al. |
| 2014/0342573 | A1 | 11/2014 | Hirose et al. |
| 2015/0255274 | A1* | 9/2015 | Yamamoto ........ C23C 16/45553 118/697 |
| 2015/0364318 | A1 | 12/2015 | Hirose et al. |
| 2017/0103885 | A1 | 4/2017 | Nakamura et al. |
| 2017/0263439 | A1 | 9/2017 | Hashimoto et al. |
| 2018/0305817 | A1 | 10/2018 | Kogura et al. |
| 2018/0337031 | A1* | 11/2018 | Hashimoto ....... C23C 16/45544 |
| 2018/0342390 | A1 | 11/2018 | Xiao et al. |

FOREIGN PATENT DOCUMENTS

| | | |
|---|---|---|
| JP | 2013-179239 A | 9/2013 |
| JP | 2015-149493 A | 8/2015 |
| JP | 2015-170614 A | 9/2015 |
| JP | 2017-163078 A | 9/2017 |
| JP | 2018-195744 A | 12/2018 |
| JP | 2020-521749 A | 7/2020 |
| KR | 10-2014-0000716 A | 1/2014 |
| KR | 10-2015-0104037 A | 9/2015 |
| KR | 10-2017-0106206 A | 9/2017 |
| WO | 2017/056155 A1 | 4/2017 |

OTHER PUBLICATIONS

Taiwan Office Action issued on May 18, 2023 for Taiwan Patent Application No. 111126865.
Japanese Office Action issued on Sep. 5, 2023 for Japanese Patent Application No. 2021-157805.
Korean Office Action issued on May 28, 2024 for Korean Patent Application No. 10-2022-0120576.
Extended European Search Report issued on Feb. 20, 2023 for European Patent Application No. 22197184.9.

* cited by examiner

METHOD OF PROCESSING SUBSTRATE, SUBSTRATE PROCESSING APPARATUS, METHOD OF MANUFACTURING SEMICONDUCTOR DEVICE, AND RECORDING MEDIUM

CROSS-REFERENCE TO RELATED APPLICATION

This application is based upon and claims the benefit of priority from Japanese Patent Application No. 2021-157805, filed on Sep. 28, 2021, the entire contents of which are incorporated herein by reference.

TECHNICAL FIELD

The present disclosure relates to a method of processing a substrate, a substrate processing apparatus, a method of manufacturing a semiconductor device, and a recording medium.

BACKGROUND

In the related art, a process of forming a film containing a predetermined element, oxygen, carbon, and nitrogen on a substrate by repeating a cycle of supplying a gas containing a predetermined element such as silicon, supplying a gas containing carbon and nitrogen, and supplying a gas containing oxygen may be carried out.

However, when the same film is formed at a temperature lower than a film formation temperature in the related art, concentration of nitrogen in the film may decrease.

SUMMARY

Some embodiments of the present disclosure provide a technique capable of obtaining a desired nitrogen concentration in a film even at a low temperature.

According to some embodiments of the present disclosure, there is provided a technique that includes: (a) supplying a first gas containing a predetermined element to a substrate; (b) supplying a second gas containing carbon and nitrogen to the substrate; (c) supplying a nitrogen-containing gas activated by plasma to the substrate; (d) supplying an oxygen-containing gas to the substrate; and (e) forming a film containing at least the predetermined element, oxygen, carbon, and nitrogen on the substrate by: performing a cycle a first number of times of two or more, the cycle performing (a) to (d); or performing a cycle once or more, the cycle performing (a) to (d) in this order.

BRIEF DESCRIPTION OF DRAWINGS

The accompanying drawings, which are incorporated in and constitute a part of the specification, illustrate embodiments of the present disclosure.

DETAILED DESCRIPTION

Reference will now be made in detail to various embodiments, examples of which are illustrated in the accompanying drawings. In the following detailed description, numerous specific details are set forth to provide a thorough understanding of the present disclosure. However, it will be apparent to one of ordinary skill in the art that the present disclosure may be practiced without these specific details. In other instances, well-known methods, procedures, systems, and components are not described in detail so as not to obscure aspects of the various embodiments.

<Embodiments of the Present Disclosure>

Hereinafter, embodiments of the present disclosure will be described mainly with reference to FIGS. 1 to 5.

The drawings used in the following description are schematic, and dimensional relationships, ratios, and the like of various components shown in figures may not match actual ones. Further, dimensional relationship, ratios, and the like of various components among plural figures may not match each other.

(1) Configuration of Substrate Processing Apparatus

Figure 1:
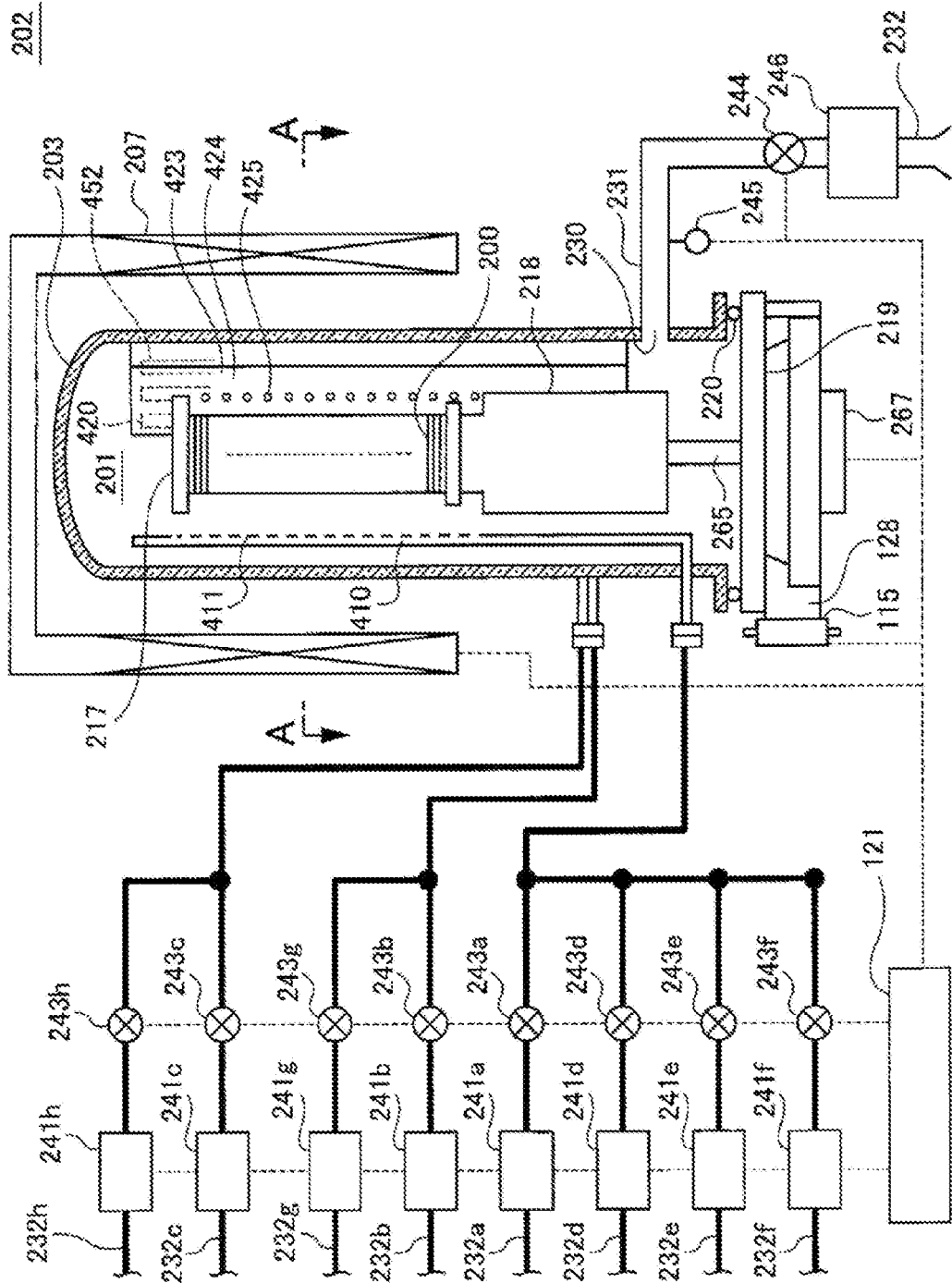
FIG. 1 is a view showing a schematic configuration example of a substrate processing apparatus according to embodiments of the present disclosure, in which a portion of a process furnace is shown in a schematic vertical cross section.
Figure 2:
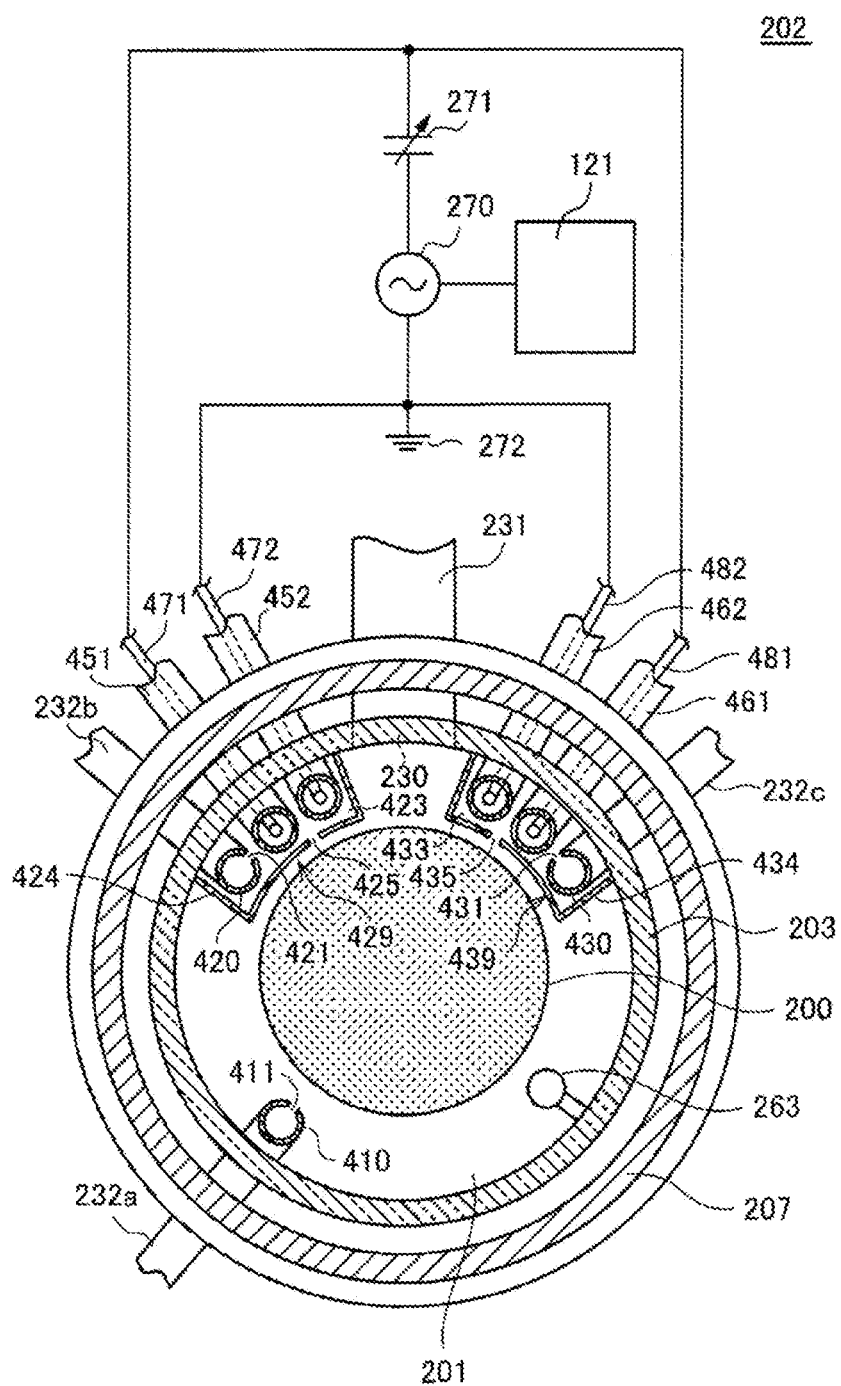
FIG. 2 is a schematic cross-sectional view of the process furnace shown in FIG. 1, which is taken along line A-A.

As shown in FIG. 1, a process furnace 202 includes a heater 207 as a temperature regulator (a heating part). The heater 207 also functions as an activator (an exciter) configured to thermally activate (excite) a gas.

A reaction tube 203 is disposed inside the heater 207 to be concentric with the heater 207. The reaction tube 203 is made of, for example, heat resistant material such as quartz ($SiO_2$) or silicon carbide (SiC), and is formed in a cylindrical shape with its upper end closed and its lower end opened.

A seal cap 219, which serves as a furnace opening lid configured to be capable of hermetically sealing a lower end opening of the reaction tube 203, is provided under the reaction tube 203. A seal (hereinafter referred to as an O-ring) 220 is interposed between an annular flange provided at the lower opening end portion of the reaction tube 203 and the upper surface of the seal cap 219 to air-tightly seal therebetween. A process chamber 201 is formed at least by the reaction tube 203 and the seal cap 219. A wafer 200 as a substrate is processed in the process chamber 201.

A boat support 218 that supports a boat 217 is provided on the seal cap 219.

The boat 217 serving as a substrate support is configured to support a plurality of wafers 200, for example, 25 to 200 wafers, in such a state that the wafers 200 are arranged in a horizontal posture and in multiple stages along a vertical direction with the centers of the wafers 200 aligned with one another.

A boat rotator 267 configured to rotate the boat 217 is installed on the opposite side of the seal cap 219 to the process chamber 201.

The seal cap 219 is configured to be vertically moved up or down by a boat elevator 115 as an elevating mechanism installed outside the reaction tube 203.

The process furnace 202 described above is configured such that the boat 217 in which the wafers 200 are arranged is inserted into the process chamber 201 while being supported by the boat support 218.

Nozzles 410, 420, and 430 are installed in the process chamber 201. A gas supply pipe 232a is connected to the nozzle 410, a gas supply pipe 232b is connected to the nozzle 420, and a gas supply pipe 232c is connected to the nozzle 430.

Mass flow controllers (MFCs) 241a to 241c, which are flow rate controllers (flow rate control parts), and valves 243a to 243c, which are opening/closing valves, are installed at the gas supply pipes 232a to 232c, respectively, sequentially from the upstream side of gas flow. Each of gas supply pipes 232d, 232e, and 232f is connected to the downstream side of the valve 243a. A gas supply pipe 232g is connected to the downstream side of the valve 243b. A gas supply pipe 232h is connected to the downstream side of the valve 243c. MFCs 241d to 241h and valves 243d to 243h are installed at the gas supply pipes 232d to 232h, respectively, sequentially from the upstream side of gas flow.

The downstream side end portions of the gas supply pipes 232a to 232c are connected to the end portions of the nozzles 410 to 430, respectively.

The nozzle 410 is installed in a cylindrical space between an inner wall of the reaction tube 203 and the wafer 200. A large number of gas supply holes 411 configured to supply a process gas are formed on the side surface of the nozzle 410.

The nozzle 420 is provided inside a buffer chamber 423 which is a gas distribution space (discharge chamber or discharge space).

The buffer chamber 423 is formed by the inner wall of the reaction tube 203 and a buffer chamber wall 424. A gas supply hole 425 configured to supply a gas is formed on a wall of the buffer chamber wall 424 adjacent to the wafer 200.

The nozzle 420 is installed on one end side of the buffer chamber 423 along the inner wall of the reaction tube 203 from a lower portion to an upper portion of the inner wall. A gas supply hole 421 configured to supply a gas is formed on the side surface of the nozzle 420.

The nozzle 430 is installed in a buffer chamber 433 which is a gas distribution space (discharge chamber or discharge space).

The buffer chamber 433 is formed by the inner wall of the reaction tube 203 and a buffer chamber wall 434. A gas supply hole 435 configured to supply a gas is formed on a wall of the buffer chamber wall 434 adjacent to the wafer 200.

The nozzle 430 is installed on one end side of the buffer chamber 433 along the inner wall of the reaction tube 203 from the lower portion to the upper portion of the inner wall. A gas supply hole 431 configured to supply a gas is formed on the side surface of the nozzle 430.

Rod-shaped electrodes 471 and 472 are arranged in the buffer chamber 423. The rod-shaped electrodes 471 and 472 are protected by being covered with electrode protective tubes 451 and 452, respectively. The rod-shaped electrode 471 is connected to a radio frequency (RF) power source 270 via a matcher 271, and the rod-shaped electrode 472 is connected to a ground 272 as a reference potential. As a result, plasma is generated in a plasma generation region between the rod-shaped electrode 471 and the rod-shaped electrode 472. A first plasma generation structure 429 mainly includes the rod-shaped electrodes 471 and 472, the electrode protective tubes 451 and 452, the buffer chamber 423, and the gas supply hole 425.

Rod-shaped electrodes 481 and 482 are arranged in the buffer chamber 433. The rod-shaped electrodes 481 and 482 are protected by being covered with electrode protective tubes 461 and 462, respectively. Similar to the first plasma generation structure 429, plasma is generated in a plasma generation region between the rod-shaped electrodes 481 and 482. A second plasma generation structure 439 mainly includes the rod-shaped electrodes 481 and 482, the electrode protective tubes 461 and 462, the buffer chamber 433, and the gas supply holes 435.

The plasma generated in the embodiments of the present disclosure is called a remote plasma. In the remote plasma, the plasma generated between the electrodes is transported to a surface of a workpiece by a flow of gas or the like to perform a plasma process. Active species contained in the plasma are supplied from the outer periphery toward the center of the wafer 200 via the gas supply hole 425 of the buffer chamber 423 and the gas supply hole 435 of the buffer chamber 433.

An exhaust port 230 is provided at the bottom of the reaction tube 203. The exhaust port 230 is connected to an exhaust pipe 231.

A first gas containing a predetermined element, which is a process gas, is supplied from the gas supply pipe 232a into the process chamber 201 via the MFC 241a, the valve 243a, and the nozzle 410.

A gas containing nitrogen (N), which is a process gas, is supplied from the gas supply pipe 232b into the process chamber 201 via the MFC 241b, the valve 243b, and the nozzle 420.

A gas containing nitrogen (N), which is a process gas, is supplied from the gas supply pipe 232c into the process chamber 201 via the MFC 241c, the valve 243c, and the nozzle 430.

A second gas containing at least carbon (C) and nitrogen (N) in one molecule, which is a process gas, is supplied from the gas supply pipe 232d into the process chamber 201 via the MFC 241d, the valve 243d, and the nozzle 410.

A gas containing oxygen (O), which is a process gas, is supplied from the gas supply pipe 232e into the process chamber 201 via the MFC 241e, the valve 243e, and the nozzle 410.

An inert gas is supplied from the gas supply pipes 232f to 232h into the process chamber 201 via the MFCs 241f to 241h, the valves 243f to 243h, the gas supply pipes 232a to 232c, and the nozzles 410, 420, and 430, respectively. The inert gas acts as a purge gas, a carrier gas, a dilution gas, or the like.

A first supply system (also referred to as a first gas supply system or a precursor supply system) mainly includes the gas supply pipe 232a, the MFC 241a, and the valve 243a. A second supply system (also referred to as a second gas supply system) mainly includes the gas supply pipe 232d, the MFC 241d, and the valve 243d. A third supply system (also referred to as a N-containing gas supply system) mainly includes the gas supply pipe 232b, the MFC 241b, the valve 243b, the gas supply pipe 232c, the MFC 241c, and the valve 243c. A fourth supply system (also referred to as an O-containing gas supply system or an oxidizing gas supply system) mainly includes the gas supply pipe 232e, the MFC 241e, and the valve 243e. An inert gas supply system mainly includes the gas supply pipes 232f to 232h, the MFCs 241f to 241h, and the valves 243f to 243h.

A vacuum pump 246 as a vacuum exhauster is connected to the exhaust pipe 231 via a pressure sensor 245, which is a pressure detector (pressure detection part) configured to detect an internal pressure of the process chamber 201, and an auto pressure controller (APC) valve 244, which is a pressure regulator (pressure regulation part). The APC valve 244 is configured to be capable of performing or stopping a vacuum exhausting operation in the process chamber 201 by opening/closing the valve while the vacuum pump 246 is actuated. The APC valve 244 is also configured to be capable of regulating the internal pressure of the process chamber 201 by adjusting an opening state of the valve based on pressure information detected by the pressure sensor 245 while the vacuum pump 246 is actuated.

A temperature sensor 263 as a temperature detector is installed in the reaction tube 203. By regulating a state of supplying electric power to the heater 207 based on temperature information detected by the temperature sensor 263, an internal temperature of the process chamber 201 may be set to a desired temperature distribution.

Figure 3:
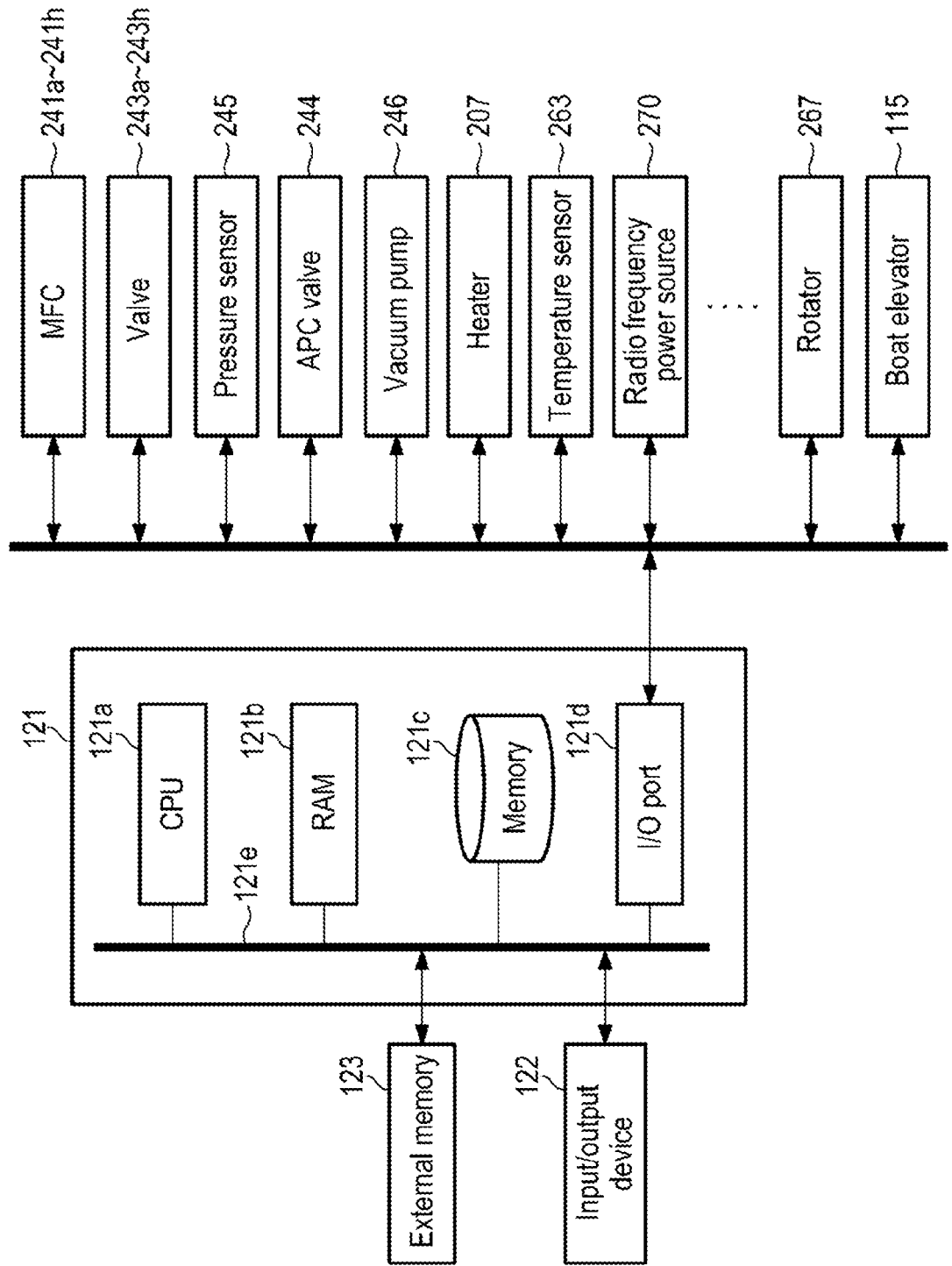
FIG. 3 is a block diagram that explains a configuration of a controller of the substrate processing apparatus according to the embodiments of the present disclosure

As shown in FIG. 3, a controller 121, which is a control part (control means or unit), is configured as a computer including a central processing unit (CPU) 121a, a random access memory (RAM) 121b, a memory 121c, and an I/O port 121d. The RAM 121b, the memory 121c, and the I/O port 121d are configured to be capable of exchanging data with the CPU 121a via an internal bus 121e. An input/output device 122 formed of, e.g., a touch panel or the like, is connected to the controller 121.

The memory 121c is configured by, for example, a flash memory, a hard disk drive (HDD), a solid state drive (SSD) or the like. A control program that controls operations of a substrate processing apparatus, a process recipe in which sequences and conditions of a method of manufacturing a semiconductor device (a method of processing a substrate) to be described later are written, and the like are readably stored in the memory 121c. The process recipe functions as a program that causes the controller 121 to execute each process (each step) in the method of manufacturing a semiconductor device (the method of processing a substrate) to be described later, thus obtaining a predetermined result. Hereinafter, the process recipe and the control program may be generally and simply referred to as a "program." Furthermore, the process recipe may be simply referred to as a "recipe." When the term "program" is used herein, it may indicate a case of including the recipe, a case of including the control program, or a case of including both the recipe and the control program. The RAM 121b is configured as a memory area (work area) in which programs or data read by the CPU 121a are temporarily stored.

The I/O port 121d is connected to the MFCs 241a to 241h, the valves 243a to 243h, the pressure sensor 245, the APC valve 244, the vacuum pump 246, the temperature sensor 263, the heater 207, the radio frequency power source 270, the rotator 267, the boat elevator 115, and so on.

The CPU 121a is configured to read and execute the control program from the memory 121c. The CPU 121a is also configured to be capable of reading the recipe from the memory 121c according to an input of an operation command from the input/output device 122. The CPU 121a is configured to be capable of controlling the flow rate regulating operation of various kinds of gases by the MFCs 241a to 241h, the opening/closing operation of the valves 243a to 243h, the opening/closing operation of the APC valve 244, the pressure regulating operation performed by the APC valve 244 based on the pressure sensor 245, the actuating and stopping operation of the vacuum pump 246, the temperature regulating operation performed by the heater 207 based on the temperature sensor 263, the control operation of radio frequency power supplied from the radio frequency power source 270, the operation of rotating the boat 217 with the rotator 267 and adjusting the rotation speed of the boat 217, the operation of moving the boat 217 up or down by the boat elevator 115, and so on, according to contents of the read recipe.

The controller 121 may be configured by installing, on the computer, the aforementioned program stored in an external memory 123. Examples of the external memory 123 may include a magnetic disk such as a HDD, an optical disc such as a CD, a magneto-optical disc such as an MO, a semiconductor memory such as an USB memory or a SSD, and the like. The memory 121c or the external memory 123 is configured as a computer-readable recording medium. Hereinafter, the memory 121c and the external memory 123 may be generally and simply referred to as a "recording medium." When the term "recording medium" is used herein, it may indicate a case of including the memory 121c, a case of including the external memory 123, or a case of including both the memory 121c and the external memory 123. Furthermore, the program may be provided to the computer by using communication means or unit such as the Internet or a dedicated line, instead of using the external memory 123.

(2) Substrate Processing Process

Figure 5:
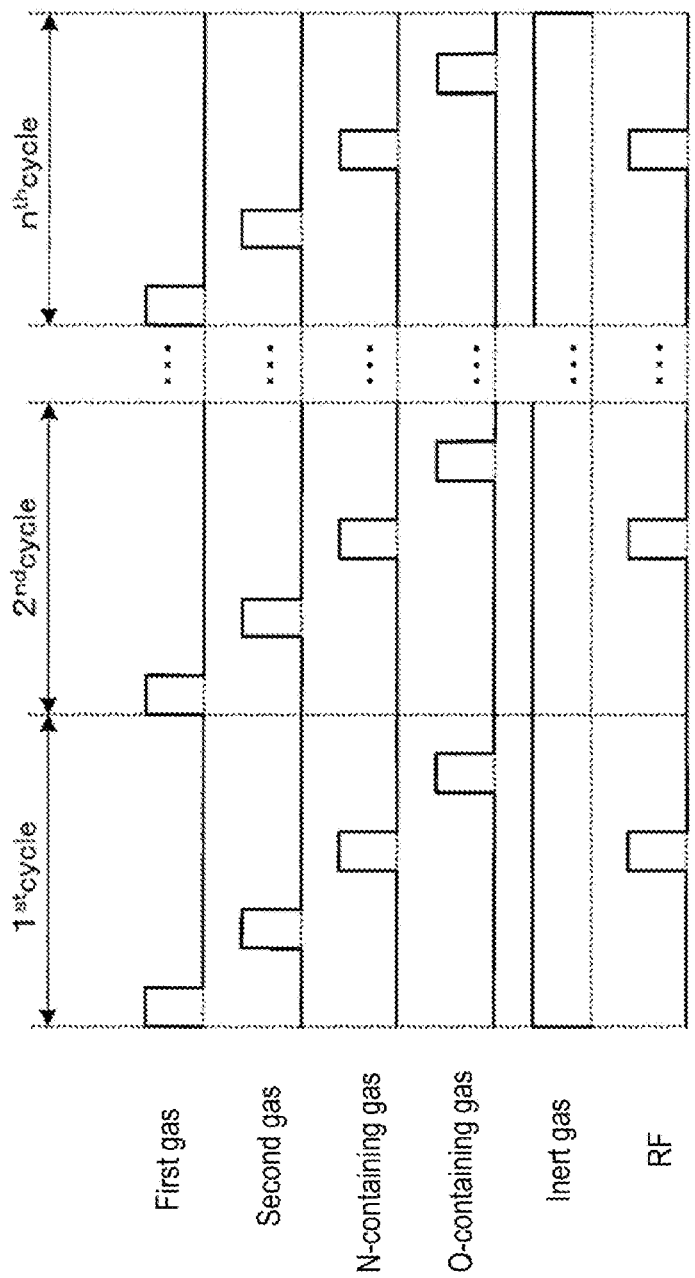
FIG. 5 is a diagram showing a timing of gas supply in a film-forming process according to the embodiments of the present disclosure.

As a process of manufacturing a semiconductor device by using the above-described substrate processing apparatus, an example of a processing sequence of forming a film containing a predetermined element, O, C, and N on a wafer 200 will be described mainly with reference to FIG. 5. In the following descriptions, the operations of the respective components constituting the substrate processing apparatus are controlled by the controller 121.

A processing sequence in the embodiments of the present disclosure includes:
(a) a step of supplying a first gas containing a predetermined element to a wafer 200;
(b) a step of supplying a second gas containing at least C and N in one molecule to the wafer 200;
(c) a step of supplying a N-containing gas activated by plasma to the wafer 200; and
(d) a step of supplying a gas containing O to the wafer 200, wherein a film containing at least the predetermined element, O, C, and N is formed on the wafer 200 by performing a cycle twice or more, the cycle non-simultaneously performing (a) to (d).

In the present disclosure, for the sake of convenience, a processing sequence in which the cycle non-simultaneously performing the above-described (a) to (d) in this order is performed a predetermined number of times may be indicated as follows. The same notation is used also in the following description of other embodiments, modifications, and the like.

(First gas→Second gas→N-containing gas*→O-containing gas)×n (n is an integer of 2 or more)

Here, the N-containing gas* indicates supply of a N-containing gas activated by plasma.

When the term "wafer" is used in the present disclosure, it may refer to "a wafer itself" or "a stacked body of a wafer and certain layers or films formed on a surface of the wafer." When the phrase "a surface of a wafer" is used in the present disclosure, it may refer to "a surface of a wafer itself" or "a surface of a certain layer formed on a wafer." When the expression "a certain layer is formed on a wafer" is used in the present disclosure, it may mean that "a certain layer is formed directly on a surface of a wafer itself" or that "a certain layer is formed on a layer formed on a wafer." When the term "substrate" is used in the present disclosure, it may be synonymous with the term "wafer."

(Wafer Charging and Boat Loading)

After the boat 217 is charged with a plurality of wafers 200 (wafer charging), the shutter is moved by a shutter opening/closing mechanism and the lower end opening of the reaction tube 203 is opened (shutter open). Thereafter, the boat 217 charged with the plurality of wafers 200 is lifted up by the boat elevator 115 to be loaded into the process chamber 201 (boat loading). In this state, the seal cap 219 seals the lower end of the reaction tube 203 via the O-ring 220.

(Pressure Regulation and Temperature Regulation)

After that, the interior of the process chamber 201, that is, a space where the wafers 200 are placed, is vacuum-exhausted (decompression-exhausted) by the vacuum pump 246 to reach a desired pressure (state of vacuum). At this time, an internal pressure of the process chamber 201 is measured by the pressure sensor 245, and the APC valve 244 is feedback-controlled based on the measured pressure information. Further, the wafers 200 in the process chamber 201 are heated by the heater 207 to reach a desired processing temperature. At this time, the state of supplying electric power to the heater 207 is feedback-controlled based on the temperature information detected by the temperature sensor 263 such that a temperature distribution in the process chamber 201 becomes a desired temperature distribution. Further, the rotation of the wafers 200 by the rotator 267 is started. The exhaust of the interior of the process chamber 201 and the heating and rotation of the wafers 200 are continuously performed at least until the processing on the wafers 200 is completed.

(Film-Forming Process)

After that, steps S1 to S8 shown below are performed.

[First Gas Supply: Step S1]

The valve 243a is opened to allow a first gas to flow through the gas supply pipe 232a. A flow rate of the first gas is adjusted by the MFC 241a, and the first gas is supplied into the process chamber 201 via the nozzle 410 and is exhausted via the exhaust port 230. In this operation, the first gas is supplied to the wafer 200. At this time, the valves 243f to 243h may be opened to allow an inert gas to be supplied into the process chamber 201 via the nozzles 410 to 430, respectively.

Process conditions when the first gas is supplied in step S1 are exemplified as follows.

Processing temperature: 450 to 550 degrees C.
Processing pressure: 1 to 1,200 Pa, specifically 20 to 200 Pa
First gas supply flow rate: 0.1 to 1.5 slm, specifically 0.1 to 0.5 slm
First gas supply time: 10 to 60 seconds, specifically 20 to 40 seconds
Inert gas supply flow rate (for each gas supply pipe): 0 to 10 slm, specifically 3 to 7 slm In the present disclosure, the notation of a numerical range such as "1 to 1,200 Pa" means that a lower limit value and an upper limit value are included in the range. Therefore, for example, "1 to 1,200 Pa" means "1 Pa or higher and 1,200 Pa or lower." The same applies to other numerical ranges. In the present disclosure, the processing temperature means the temperature of the wafer 200, and the processing pressure means the internal pressure of the process chamber 201. Further, the supply flow rate of 0 slm means a case where no substance is supplied. These apply equally to the following description.

As the first gas, a gas containing a predetermined element (for example, silicon (Si), germanium (Ge), titanium (Ti), etc.) may be used. The first gas may contain, for example, halogen from the viewpoint of adsorption to adsorption sites (for example, NH termination) on the surface of the wafer 200. For example, the first gas may contain at least one selected from the group of chlorine (Cl), fluorine (F), bromine (Br), and iodine (I) as a halogen, and more specifically Cl among them.

Specifically, as the first gas, for example, halosilane-based gases may be used, and more specifically, among them, a chlorosilane-based gas may be used. Here, halosilane means silane containing a halogen element as a substituent, and chlorosilane means silane containing chlorine (Cl) as a substituent. Example of the halogen element contained in halosilane may include the above-mentioned halogen element, specifically Cl, F, Br, I, and the like. As the first gas, in particular, halosilanes in which the number of Si atoms contained in one molecule is two or more (specifically, two) may be used, and among them, chlorosilane in which the number of Si atoms contained in one molecule is two or more (specifically, two) may be used. Furthermore, specifically, halosilanes containing a Si—Si bond in molecule may be used as the first gas, and more specifically, among them, chlorosilane containing a Si—Si bond in molecule may be used.

Examples of the first gas may include chlorosilane-based gases such as a hexachlorodisilane ($Si_2Cl_6$, abbreviation: HCDS) gas, a monochlorosilane ($SiH_3Cl$, abbreviation: MCS) gas, a dichlorosilane ($SiH_2Cl_2$, abbreviation: DCS) gas, a trichlorosilane ($SiHCl_3$, abbreviation: TCS) gas, a tetrachlorosilane ($SiCl_4$, abbreviation: STC) gas, and an octachlorotrisilane ($Si_3Cl_8$, abbreviation: OCTS) gas. Further, examples of the first gas may include fluorosilane-based gases such as a tetrafluorosilane ($SiF_4$) gas and a difluorosilane ($SiH_2F_2$) gas, bromosilane-based gases such as a tetrabromosilane ($SiBr_4$) gas and a dibromosilane ($SiH_2Br_2$) gas, and iodosilane-based gases such as a tetraiodosilane ($SiI_4$) gas and a diiodosilane ($SiH_2I_2$) gas.

Further, examples of the first gas may include alkylchlorosilane-based gases such as a dimethyldichlorosilane (($CH_3)_2SiCl_2$) gas, a trimethylchlorosilane (($CH_3)_3SiCl$)

gas, a 1,1,2,2-tetrachloro-1,2-dimethyldisilane ($(CH_3)_2Si_2Cl_4$, abbreviation: TCDMDS) gas, and a 1,2-dichloro-1,1,2,2-tetramethyldisilane ($(CH_3)_4Si_2Cl_2$, abbreviation: DCTMDS) gas, alkylfluorosilane-based gases such as a dimethyldifluorosilane ($(CH_3)_2SiF_2$) gas and a trimethylfluorosilane ($(CH_3)_3SiF$) gas, alkylbromosilane-based gases such as a dimethyldibromosilane ($(CH_3)_2SiBr_2$) gas and a trimethylbromosilane ($(CH_3)_3SiBr$) gas, and alkyliodosilane-based gases such as a dimethyldiiodosilane ($(CH_3)_2SiI_2$) gas and a trimethyliodosilane ($(CH_3)_3SiI$) gas.

Further, examples of the first gas may include alkylenechlorosilane-based gases such as a bis(trichlorosilyl)methane ($(SiCl_3)_2CH_2$, abbreviation: BTCSM) gas and a 1,2-bis(trichlorosilyl)ethane ($(SiCl_3)_2C_2H_4$, abbreviation: BTCSE) gas, and a gas of a compound, which contains a cyclic structure composed of Si and C and a halogen element, such as a 1,1,3,3-tetrachloro-1,3-disilacyclobutane ($C_2H_4Cl_4Si_2$, abbreviation: TCDSCB) gas.

Further, examples of the first gas may include chlorogermane-based gases such as a monochlorogermane ($GeH_3Cl$) gas, a dichlorogermane ($GeH_2Cl_2$) gas, a trichlorogermane ($GeHCl_3$) gas, and a tetrachlorogermane ($GeCl_4$) gas, fluorogermane-based gases such as a tetrafluorogermane ($GeF_4$) gas, bromogermane-based gases such as a tetrabromogermane ($GeBr_4$) gas, and iodogermane-based gases such as a tetraiodogermane ($GeI_4$) gas.

Further, examples of the first gas may include gases of halide metal compound, such as a tetrachlorotitanium ($TiCl_4$) gas, a tetrafluorotitanium ($TiF_4$) gas, a tetrabromotitanium ($TiBr_4$) gas, and a tetraiodotitanium ($TiI_4$) gas.

One or more selected from the group of the above-mentioned gases may be used as the first gas. The first gas acts as a Si source when the first gas contains Si, the first gas acts as a Ge source when the first gas contains Ge, and the first gas acts as a Ti source when the first gas contains Ti. Among the above, at least one selected from the group of halosilane and metal halide may be used as the first gas.

Examples of the inert gas may include a nitrogen ($N_2$) gas and rare gases such as an argon (Ar) gas, a helium (He) gas, a neon (Ne) gas, and a xenon (Xe) gas. One or more selected from the group of these gases may be used as the inert gas. This point also applies to each step using an inert gas, which will be described later. The inert gas act as a purge gas, a carrier gas, a dilution, or the like.

Figure 4A:
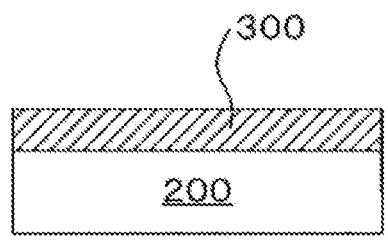
FIG. 4A is a cross-sectional view of a substrate after a first layer is formed on a surface of the substrate.

Then, as shown in FIG. 4A, a first layer 300 containing a predetermined element is formed on the surface of the wafer 200 by supplying the first gas to the wafer 200 under the above-mentioned process condition. The first layer 300 is formed by physical adsorption or chemical adsorption of precursor molecules containing a predetermined element, chemical adsorption of substances partially dissociated from precursor molecules, deposition of thermal decomposition products of the first gas, and the like on the surface of the wafer 200. That is, a layer containing at least a predetermined element (for example, silicon (Si)) constituting a film, which is contained in the first gas, is formed as the first layer 300. Moreover, when the first gas contains an element (for example, a halogen element) other than the predetermined element, the first layer 300 may also contain the element other than the predetermined element. For example, when a chlorosilane-based gas is used as the first gas, the first layer 300, which is a Si-containing layer containing Si, is formed.

[Residual Gas Removal: Step S2]

After the first layer 300 is formed on the surface of the wafer 200, the valve 243a is closed to stop the supply of the first gas into the process chamber 201. Then, the interior of the process chamber 201 is vacuum-exhausted to remove the first gas remaining in the process chamber 201 and a gaseous substance generated when the first layer 300 is formed, from the process chamber 201. At this time, the valves 243f to 243h may be opened to allow an inert gas to be supplied into the process chamber 201 via the nozzles 410 to 430. The inert gas supplied from the nozzles 410 to 430 acts as a purge gas, thereby purging the interior of the process chamber 201 (purging).

Process conditions when the purging is performed in step S2 are exemplified as follows.
Processing temperature: 450 to 550 degrees C.
Processing pressure: 1 to 500 Pa, specifically 20 to 100 Pa
Inert gas supply flow rate (for each gas supply pipe): 0 to 10 slm, specifically 1 to 5 slm
Inert gas supply time: 5 to 60 seconds, specifically 20 to 40 seconds

[Second Gas Supply: step S3]

In step S3, a second gas is supplied to the wafer 200.

Specifically, the valve 243d is opened to allow the second gas to flow through the gas supply pipe 232d. A flow rate of the second gas is regulated by the MFC 241d, and the second gas is supplied into the process chamber 201 via the nozzle 410 and is exhausted via the exhaust port 230. In this operation, the second gas is supplied to the wafer 200. At this time, the valves 243f to 243h may be opened to allow an inert gas to be supplied into the process chamber 201 via the nozzles 410 to 430, respectively.

Process conditions when the second gas is supplied in step S3 are exemplified as follows.
Processing temperature: 450 to 550 degrees C.
Processing pressure: 1 to 1,200 Pa, specifically 600 to 1,000 Pa
Second gas supply flow rate: 0.1 to 1.5 slm, specifically 0.2 to 0.8 slm
Second gas supply time: 10 to 120 seconds, specifically 10 to 60 seconds
Other process conditions may be the same as the process conditions in step S1.

A gas containing at least carbon (C) and nitrogen (N) in one molecule may be used as the second gas. The second gas may contain, for example, C, N, and H from the viewpoint of modification effect. That is, for example, an amine-based gas, an organic hydrazine-based gas, or the like may be used as the second gas.

Examples of the amine-based gas may include ethylamine-based gases such as a triethylamine ($(C_2H_5)_3N$, abbreviation: TEA) gas, a monoethylamine ($(C_2H_5)NH_2$, abbreviation: MEA) gas, and a diethylamine ($(C_2H_5)_2NH$, abbreviation: DEA) gas, and methylamine-based gases such as a monomethylamine ($(CH_3)NH_2$, abbreviation: MMA) gas, a dimethylamine ($(CH_3)_2NH$, abbreviation: DMA) gas, and a trimethylamine ($(CH_3)_3N$, abbreviation: TMA) gas. The amine-based gas is also a N- and H-containing gas.

Examples of the organic hydrazine-based gas may include methylhydrazine-based gases such as a monomethylhydrazine ($(CH_3)HN_2H_2$, abbreviation: MMH) gas, a dimethylhydrazine ($(CH_3)_2N_2H_2$, abbreviation: DMH) gas, and a trimethylhydrazine ($(CH_3)_2N_2(CH_3)H$, abbreviation: TMH) gas. The organic hydrazine-based gas is also a N- and H-containing gas.

One or more selected from the group of the above-mentioned gases may be used as the second gas. When the second gas contains C and N, the second gas acts as a C source as well as a N source.

Figure 4B:
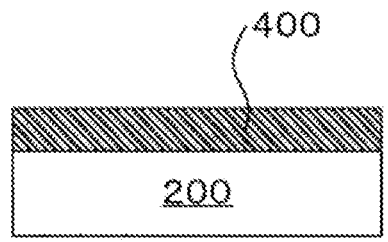
FIG. 4B is a cross-sectional view of the substrate after a second layer is formed on the surface of the substrate.

By supplying the second gas to the wafer 200 under the above-mentioned process condition, a second layer 400 is formed on the surface of the wafer 200, as shown in FIG. 4B.

The second layer 400 is formed by causing the surface of the first layer 300, which is formed on the surface of the wafer 200, to react with the second gas containing C and N in one molecule. This reaction allows C and N, which are contained in the second gas, to be adsorbed on the surface of the first layer 300. That is, a C- and N-containing layer is formed on the surface of the first layer 300. As a result, the second layer 400 containing a predetermined element, C, and N is formed. That is, in step S3, the first layer 300 containing the predetermined element may be modified into the second layer 400 containing the predetermined element, C, and N by chemical adsorption or the like of the second gas on the first layer 300. Therefore, step S3 may also be called a modifying step by the second gas containing C and N. For example, when a chlorosilane-based gas is used as the first gas and an amine-based gas is used as the second gas, the first layer 300, which is a Si-containing layer, is modified into the second layer 400 containing Si, C, and N, that is, a silicon carbonitride (SiCN) layer.

When the second layer 400 is formed, impurities (for example, Cl and the like) contained in the first layer 300 are removed from the first layer 300 during the modifying reaction of the first layer 300 by the second gas. As a result, the second layer 400 becomes a layer containing fewer impurities such as Cl than the first layer 300 formed in step S1. The impurities removed from the first layer 300 form a gaseous substance to be discharged out of the process chamber 201.

[Residual Gas Removal: Step S4]

After the second layer 400 is formed on the surface of the wafer 200, the valve 243d is closed to stop the supply of the second gas into the process chamber 201. Then, the second gas remaining in the process chamber 201 and a gaseous substance generated when the second layer 400 is formed are removed from the interior of the process chamber 201 according to the same processing procedure and process conditions as the purging in the above-described step S2 (purging).

Here, a high-k film-forming process may be performed at a low temperature of 450 to 550 degrees C. However, in a case the film-forming process is performed at the low temperature of 450 to 550 degrees C., an amount (content or concentration) of N added to the second layer 400 may decrease. The decrease in the N content in the film also leads to a decrease in film quality such as a decrease (deterioration) in dry etching resistance. Therefore, in the present disclosure, after step S4, the following steps S5 and S6 are performed to improve the content (concentration) of N in the film.

[Supply of N-containing Gas Activated by Plasma: step S5]

After step S4 is completed, step S5 is performed. In step S5, a N-containing gas activated by plasma is supplied to the wafer 200.

Specifically, the valves 243b and 243c are opened to allow the N-containing gas to flow through the gas supply pipes 232b and 232c. A flow rate of the N-containing gas is regulated by the MFCs 241b and 241c, and the N-containing gas is supplied into the buffer chambers 423 and 433 via the nozzles 420 and 430, respectively. At this time, by applying the radio frequency power, the N-containing gas supplied into the buffer chambers 423 and 433 is plasma-excited and is supplied as an active species from the gas supply holes 425 and 435 into the process chamber 201 and is exhausted via the exhaust port 230. In this operation, the plasma-activated N-containing gas is supplied to the wafer 200. At this time, the valve 243f may be opened to allow an inert gas to be supplied into the process chamber 201 via the nozzle 410.

Process conditions when the plasma-activated N-containing gas is supplied in step S5 are exemplified as follows.

Processing temperature: 450 to 550 degrees C.

Processing pressure: 40 to 60 Pa

N-containing gas supply flow rate: 0.1 to 10 slm, specifically 0.5 to 3 slm

Plasmarized N-containing gas supply time: 15 to 30 seconds, specifically 20 seconds Radio frequency power: 50 to 400 W, specifically 100 to 300 W Other process conditions may be the same as the process conditions in step 1.

A N- and H-containing gas may be used as the N-containing gas. A hydrogen nitride-based gas may be used as the N- and H-containing gas. Examples of the hydrogen nitride-based gas may include an ammonia ($NH_3$) gas, a diazene ($N_2H_2$) gas, a hydrazine ($N_2H_4$) gas, a $N_3H_8$ gas, and the like.

Figure 4C:
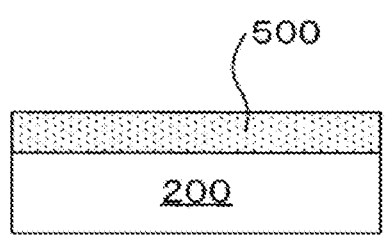
FIG. 4C is a cross-sectional view of the substrate after a third layer is formed on the surface of the substrate.

By supplying the plasma-activated N-containing gas to the wafer 200 under the above-mentioned process condition, the plasma-activated N-containing gas reacts with the second layer 400. As a result, the second layer 400 is nitrided to be modified into a third layer 500 containing the predetermined element, C, and N, as shown in FIG. 4C. That is, by supplying the plasma-activated N-containing gas, the N content in the film may be increased to strengthen bonding of each molecule. In other words, the second layer 400 is modified into the third layer 500 which contains the predetermined element, C, and N and which is higher in N concentration than the second layer 400 and contains a strong bond. For example, when a chlorosilane-based gas is used as the first gas, an amine-based gas is used as the second gas, and a hydrogen nitride-based gas is used as the N-containing gas, the second layer 400 is modified into a silicon carbonitride (SiCN) layer.

[Residual Gas Removal: Step S6]

After the third layer 500 is formed on the surface of the wafer 200, the valves 243b and 243c are closed to stop the supply of the N-containing gas into the process chamber 201. Then, the plasma-activated N-containing gas remaining in the process chamber 201 and a gaseous substance generated when the third layer 500 is formed are removed from the interior of the process chamber 201 (purging) according to the same processing procedure and process conditions as the purging in the above-described step S2.

[O-containing Gas Supply: Step S7]

In step S7, an O-containing gas is supplied to the wafer 200.

Specifically, the valve 243e is opened to allow the O-containing gas to flow through the gas supply pipe 232e. A flow rate of the O-containing gas is regulated by the MFC 241e, and the O-containing gas is supplied into the process chamber 201 via the nozzle 410 and is exhausted via the exhaust port 230. In this operation, the O-containing gas is supplied to the wafer 200. At this time, the valves 243f to 243h may be opened to allow an inert gas to be supplied into the process chamber 201 via the nozzles 410 to 430, respectively.

Process conditions when the O-containing gas is supplied in step S7 are exemplified as follows.

Processing temperature: 450 to 550 degrees C.

Processing pressure: 1 to 1,200 Pa, specifically 600 to 1,000 Pa

O-containing gas supply flow rate: 0.1 to 10 slm, specifically 0.5 to 5 slm

O-containing gas supply time: 1 to 30 seconds, specifically 1 to 15 seconds, more specifically 1 to 6 seconds Other process conditions may be the same as the process conditions in step S1.

From the viewpoint of the modifying effect, the O-containing gas may contain, for example, O, O and H, O and N, or O and C. That is, examples of the O-containing gas may include an O-containing gas, an O- and H-containing gas, an O- and N-containing gas, an O- and C-containing gas, and the like. Further, the O-containing gas may be used by being plasma-excited as well as by being thermally excited in a non-plasma atmosphere. That is, the O-containing gas may be an O-containing gas excited into a plasma state.

Examples of the O-containing gas may include an oxygen ($O_2$) gas, an ozone ($O_3$) gas, and the like. Examples of the O- and H-containing gas may include water vapor ($H_2O$ gas), a hydrogen peroxide ($H_2O_2$) gas, an $O_2$ gas+hydrogen ($H_2$) gas, an $O_3$ gas+$H_2$ gas, and the like. Examples of the O- and N-containing gas may include a nitric oxide (NO) gas, a nitrous oxide ($N_2O$) gas, a nitrogen dioxide ($NO_2$) gas, an $O_2$ gas+$NH_3$ gas, an $O_3$ gas+$NH_3$ gas, and the like. Examples of the O- and C-containing gas may include a carbon dioxide ($CO_2$) gas, a carbon monoxide (CO) gas, and the like.

In the present disclosure, description of two gases such as "$O_2$ gas+$H_2$ gas" together means a mixed gas of $O_2$ gas and $H_2$ gas. When supplying the mixed gas, the two gases may be mixed (pre-mixed) in a supply pipe and then supplied into the process chamber 201, or the two gases may be supplied separately from different supply pipes into the process chamber 201 and then mixed (post-mixed) in the process chamber 201.

One or more selected from the group of the above-mentioned gases may be used as the O-containing gas. The O-containing gas acts as an O source. In a case where the O-containing gas contains O and N, the O-containing gas may act as a N source. Further, in a case where the O-containing gas contains O and C, the O-containing gas may act as a C source.

Figure 4D:
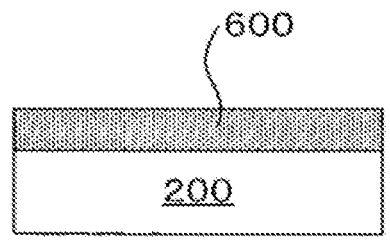
FIG. 4D is a cross-sectional view of the substrate after a fourth layer is formed on the surface of the substrate.

By supplying the O-containing gas to the wafer 200 under the above-mentioned process condition, a fourth layer 600 is formed on the surface of the wafer 200, as shown in FIG. 4D. O contained in the O-containing gas may be introduced into the third layer 500 by a reaction between the O-containing gas and the third layer 500, and as a result, the fourth layer 600 into which O is introduced is formed. That is, in step S7, the third layer 500 containing the predetermined element, C, and N may be modified (oxidized) into the fourth layer 600 containing the predetermined element, C, N, and O by oxidation. Therefore, step S7 may also be referred to as a modifying step by the O-containing gas. The fourth layer 600 may also be referred to as an oxygen-containing layer or an oxidized layer (modified layer). For example, in a case where a chlorosilane-based gas is used as the first gas, an amine-based gas is used as the second gas, a hydrogen nitride-based gas is used as the N-containing gas, and an O-containing gas is used in this step, the third layer 500 containing Si, C, and N is modified into the fourth layer 600 containing Si, C, N, and O, that is, a silicon oxycarbonitride (SiOCN) layer. Thus, in the embodiments of the present disclosure, in step S5, the N concentration in the film may be made high by adopting plasma nitridation.

[Residual Gas Removal: Step S8]

After the fourth layer 600 is formed on the surface of the wafer 200, the valve 243e is closed to stop the supply of the O-containing gas into the process chamber 201. Then, the O-containing gas remaining in the process chamber 201 and a gaseous substance generated when the fourth layer 600 is formed are removed from the interior of the process chamber 201 according to the same processing procedure and process conditions as the purging in the above-described step S2 (purging).

[Performing Predetermined Number of Times]

By performing a cycle twice or more (first number of times), the cycle including performing the above-described steps S1 to S8 non-simultaneously, that is, without synchronization or by performing a cycle once or more (first number of times), the cycle including performing the above-described steps S1 to S8 in this order non-simultaneously, a film 600, which is the fourth layer 600 containing at least the predetermined element, O, C, and N, is formed on the surface of the wafer 200. For example, a SiOCN film is formed as the film 600.

(After-Purge and Returning to Atmospheric Pressure)

After the film 600 is formed on the surface of the wafer 200, an inert gas as a purge gas is supplied into the process chamber 201 via each of the nozzles 410 to 430 and is exhausted via the exhaust port 221. As a result, the interior of the process chamber 201 is purged to remove a gas, reaction by-products, and the like remaining in the process chamber 201 from the interior of the process chamber 201 (after-purge). After that, the internal atmosphere of the process chamber 201 is substituted with an inert gas (inert gas substitution) and the internal pressure of the process chamber 201 is returned to the atmospheric pressure.

(Boat Unloading and Wafer Discharging)

After that, the seal cap 219 is moved down by the boat elevator 115 to open the lower end of the reaction tube 203. Then, the processed wafers 200 supported by the boat 217 are unloaded from the lower end of the reaction tube 203 to the outside of the reaction tube 203 (boat unloading). The processed wafers 200 are unloaded to the outside of the reaction tube 203 and are then discharged from the boat 217 (wafer discharging).

(3) Other Embodiments

Next, modifications of the film-forming process in the above-described embodiments will be described in detail. In the following modifications, points different from the above-described embodiments will be described in detail.

(First Modification)

Figure 6:
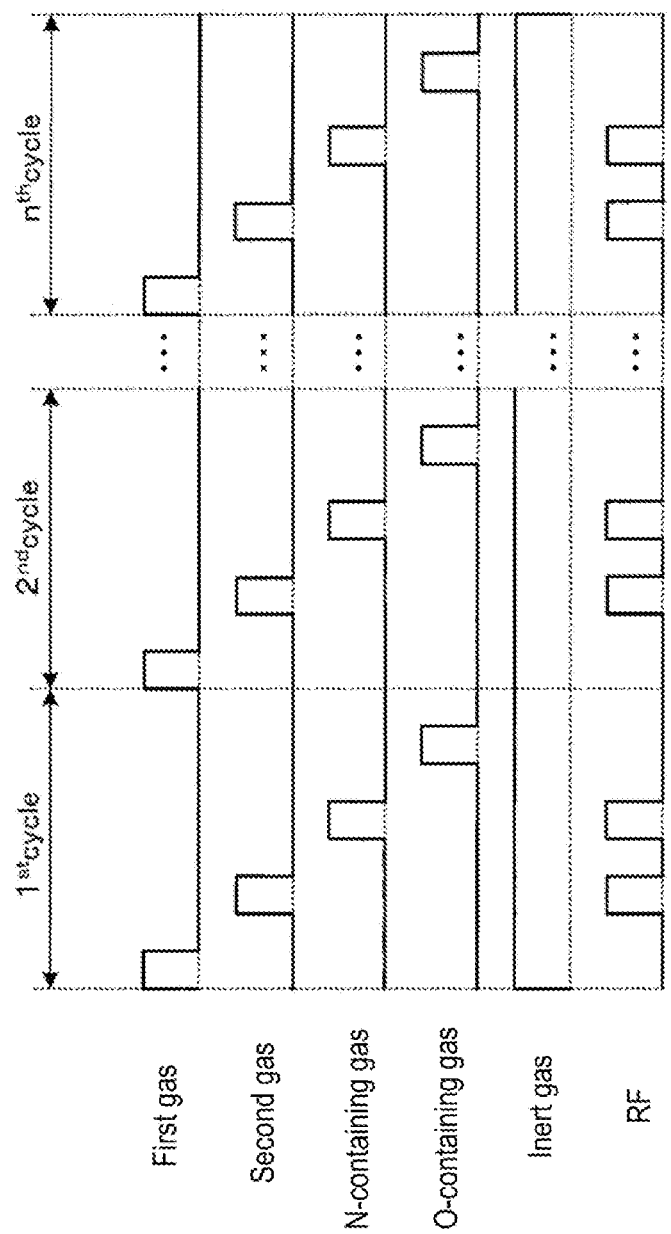
FIG. 6 is a diagram showing a modification of the timing of gas supply in the film-forming process according to the embodiments of the present disclosure.

In this modification, step S3 differs from that of the film-forming process in the above-described embodiments. In this modification, as shown in FIG. 6, in addition to step S5, in step S3, the second gas activated by plasma is supplied to the wafer 200. Specifically, in step S5, the second gas is supplied from the nozzle 420, and in step S5, the N-containing gas is supplied from the nozzle 430. That is, in step S3, the first plasma generation structure 429 is used to turn the second gas into plasma, and in step S5, the second plasma generation structure 439 is used to turn the N-containing gas into plasma. Then, after performing the above-described steps S1 and S2, step S3 shown below is performed, and after that, the above-described steps S4 to S8 are performed.

(First gas→Second gas*→N-containing gas*→O-containing gas)×n (n is an integer of 2 or more)

Here, the second gas* indicates supply of the second gas activated by plasma.

[Supply of Second Gas Activated by Plasma: Step S3]

The second gas is supplied into the buffer chamber 423 via the nozzle 420. At this time, the second gas supplied into the buffer chamber 423 is plasma-excited by the application of the radio frequency power and is supplied as an active species via the gas supply hole 425 into the process chamber 201 and is exhausted via the exhaust port 230. In this operation, the plasma-activated second gas is supplied to the wafer 200. At this time, the valves 243f and 243h may be opened to allow an inert gas to be supplied into the process chamber 201 via the nozzles 410 and 430, respectively.

Process conditions when the plasma-activated second gas is supplied in step S3 are exemplified as follows.

Processing temperature: 450 to 550 degrees C.
Processing pressure: 930 Pa
Second gas supply flow rate: 0.1 to 0.5 slm
Plasmarized second gas supply time: 12 seconds
Radio frequency power: 50 to 400 W, specifically 100 to 300 W
Other process conditions may be the same as the process conditions in step S1.

By supplying the plasma-activated second gas to the wafer 200 under the above-mentioned process condition, the second gas containing C and N in one molecule is decomposed and reacts with the first layer 300 formed on the wafer 200. That is, the first layer 300 is nitrided while C is introduced into the first layer 300. In other words, the first layer 300 may be modified into the second layer 400 containing the predetermined element, C, and N, which is nitrided by introducing more C. In this way, according to this modification, by activating the second gas as well, the concentration of N in the second layer 400 may be made higher than that of the film-forming method shown in FIG. 5.

(Second Modification)

Figure 7:
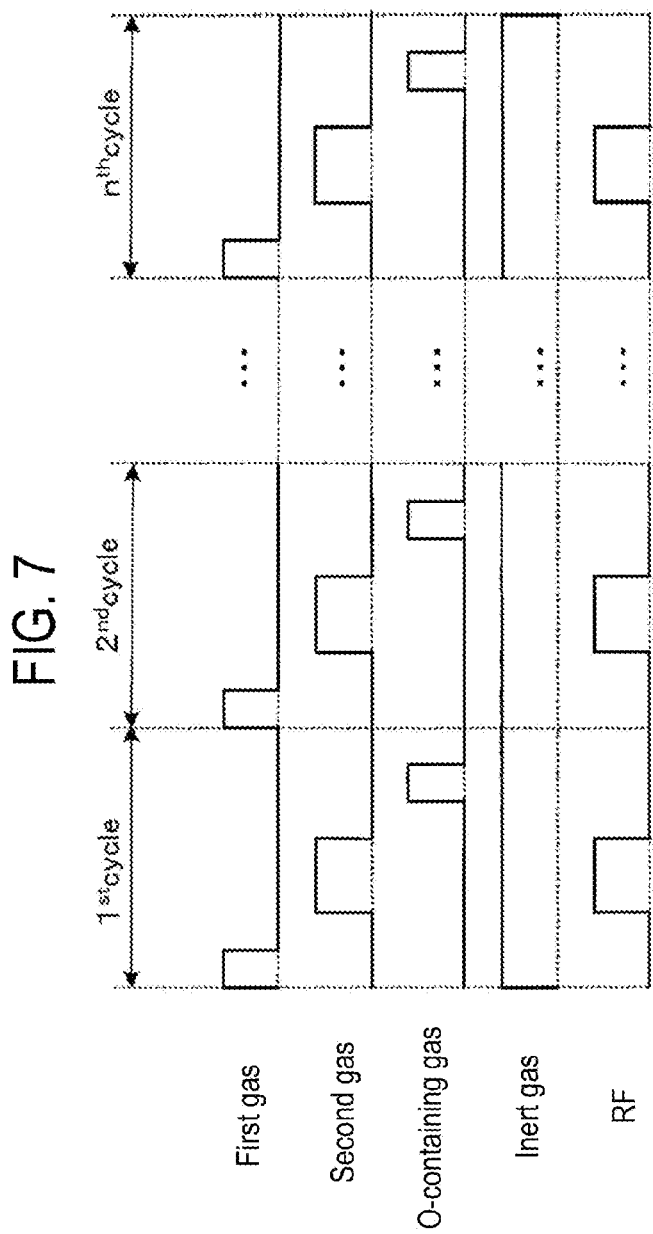
FIG. 7 is a diagram showing a modification of the timing of gas supply in the film-forming process according to the embodiments of the present disclosure.

In this modification, step S5 and step S6 of the film-forming process in the above-described embodiments are not performed. Then, as shown in FIG. 7, in step S3, the second gas activated by plasma is supplied to the wafer 200. Specifically, in step S3, the second gas is supplied from the nozzles 420 and 430. That is, in step S3, the first plasma generation structure 429 and the second plasma generation structure 439 are used. Then, after performing the above-described steps S1 and S2, step S3 shown below is performed, and the above-described steps S4, S7, and S8 are performed.

(First gas→Second gas*→O-containing gas)×n (n is an integer of 2 or more)

[Supply of Second Gas Activated by Plasma: Step S3]

The second gas is supplied into the buffer chambers 423 and 433 via the nozzles 420 and 430, respectively. At this time, the second gas supplied into the buffer chambers 423 and 433 is plasma-excited by the application of the radio frequency power and is supplied as an active species via the gas supply holes 425 and 435 into the process chamber 201 and is exhausted via the exhaust port 230. In this operation, the plasma-activated second gas is supplied to the wafer 200. At this time, the valve 243f may be opened to allow an inert gas to be supplied into the process chamber 201 via the nozzle 410.

By such a method, the content of N in the film may be increased as compared with a film formed by introducing the second gas without activating the second gas or a film formed by introducing N without activating N after the introduction of the second gas. Further, the supply time of the plasma-activated second gas may be lengthened as compared with step S3 in the above-described first modification. In this way, by lengthening the supply time of the plasma-activated second gas, the content of N in the film may be further increased without performing step S5. In addition, the number of steps (man-hours) may be reduced as compared with the above-described embodiments and the first modification, thereby improving a throughput. Other process conditions in step S3 in this modification may be the same as the process conditions in the above-described first modification. However, as a method of further increasing the content of N in the film, in addition to the method of increasing the supply time of the activated second gas, the RF power supplied at the time of activation may be increased.

(Third Modification)

Figure 8:
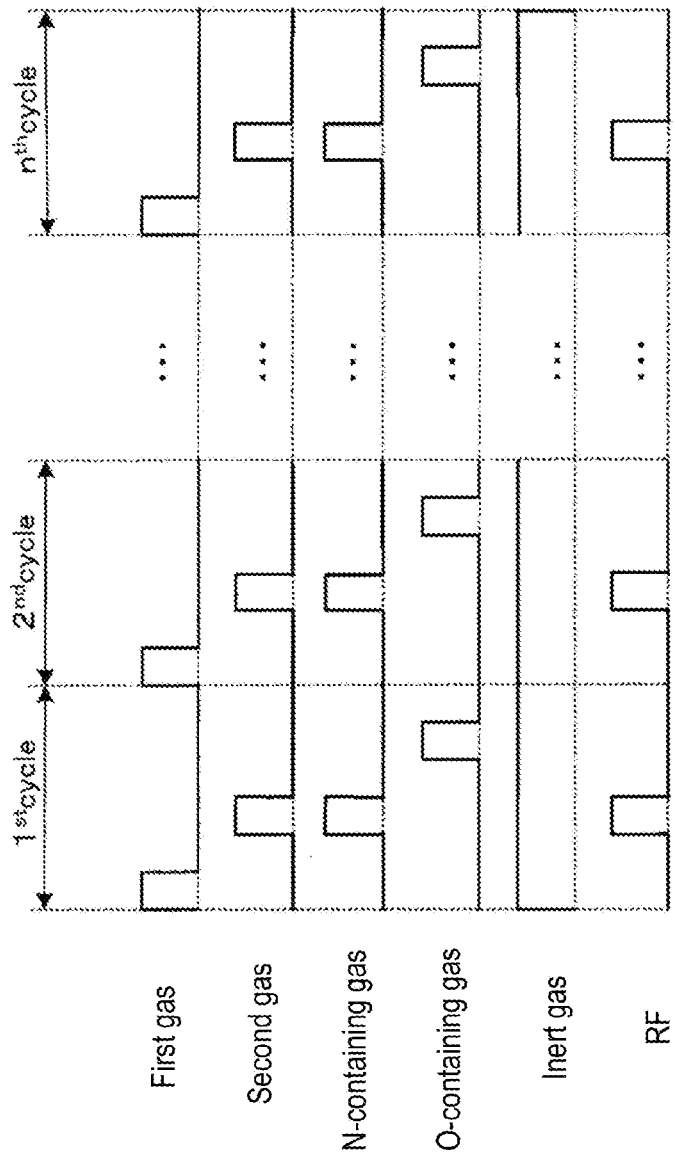
FIG. 8 is a diagram showing a modification of the timing of gas supply in the film-forming process according to the embodiments of the present disclosure.

In this modification, step S5 of the film-forming process in the above-described embodiments is performed at the same time as step S3. That is, as shown in FIG. 8, in step S3, the plasma-activated N-containing gas is supplied to the wafer 200 at the same time as the second gas is supplied. That is, after performing the above-described steps S1 and S2, step S5 is performed at the same time as step S3 to remove the residual gas, and then the above-described steps S7 and S8 are performed.

(First gas→Second gas+N-containing gas*→O-containing gas)×n (n is an integer of 2 or more)

According to this modification, as compared with the above-described embodiments and the first modification, by adopting the simultaneous supply of the second gas and the N-containing gas, the purging step may be omitted and the processing time may be shortened, thereby improving a throughput. Further, since the plasma-activated N-containing gas is supplied into the process chamber 201 at the same time as the second gas is supplied, the second gas is also plasma-excited indirectly. Therefore, the concentration of N in the film may be increased as compared with a film formed without using plasma.

According to the embodiments of the present disclosure, the nitridation is enhanced by plasma even in a low-temperature process, and therefore it is possible to obtain a SiOCN film with a low dielectric constant and a wet etching rate similar to (equivalent to) those of a SiOCN film formed at a high temperature, while maintaining a good dry etching resistance.

(4) Lamination Example

FIGS. 9A to 9E show lamination examples using films formed by the above-described film-forming process.

Here, since the film 600 formed according to the above-described embodiments and each modification is formed by supplying the N-containing gas activated by plasma, it is considered that C in the film may be desorbed by plasma excitation such that the C concentration in the film decreases.

Therefore, in the present disclosure, a film containing a predetermined element, C, O, and N, which is formed on the wafer 200 by supplying a N-containing gas activated by plasma, and a film containing at least the predetermined element, C, and N, which is formed on the wafer 200 without supplying the N-containing gas activated by plasma, are laminated. This makes it possible to maintain both C and N concentrations in the film. That is, by adopting such a laminated structure of the film formed by applying plasma and the film formed by not applying plasma, it is possible to obtain the SiOCN film with desired C and N concentrations in the laminated film.

Specifically, for example, a SiO(C)N film formed on the wafer 200 by supplying the plasma-activated N-containing gas and a Si(O)CN film formed on the wafer 200 without supplying the plasma-activated N-containing gas are laminated. By adopting this lamination process, it is possible to maintain both the desired C and N concentrations in the film. For example, in the SiO(C)N film formed by supplying the plasma-activated N-containing gas, a desired N concentration may be obtained because the N concentration may be increased. On the other hand, in the Si(O)CN film formed without supplying the plasma-activated N-containing gas, a desired C concentration may be obtained because C loss does not occur, although the N concentration is not increased. Further, by adjusting the ratio of the number of execution cycles of each process in the laminated film, the concentration balance of C and N in the laminated film is adjusted. Here, the SiO(C)N film means a SiOCN film or a SiON film, and the Si(O)CN film means a SiOCN film or a SiCN film.

The film 600 is a film containing a predetermined element, C, O, and N, which is formed by performing steps S1 to S8 of the film-forming process in the above-described embodiments by using the above-described substrate processing apparatus.

A film 700 is a film containing a predetermined element, C, and N, which is formed on the wafer 200 by performing steps S1 to S4 of the film-forming process in the above-described embodiments by using the above-described substrate processing apparatus without supplying the plasma-activated N-containing gas. That is, the film 700 is substantially an oxygen-free film.

A film 800 is a film containing a predetermined element, C, O, and N, which is formed by performing steps S1 to S4, S7, and S8 of the film-forming process in the above-described embodiments by using the above-described substrate processing apparatus without supplying the plasma-activated N-containing gas.

The processing temperature when the film 700 and the film 800 are formed is 450 to 550 degrees C., which is the same as the processing temperature when the above-described film 600 is formed.

Figure 9A:
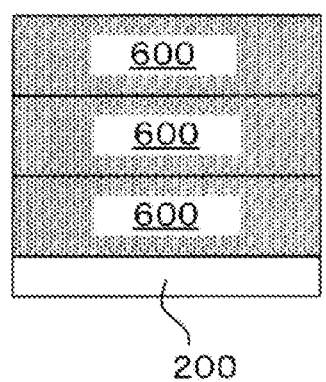
FIG. 9A is a view showing a first example of lamination of silicon oxycarbonitride layers.

FIG. 9A is a view showing a first lamination example. In FIG. 9A, when a cycle of non-simultaneously performing steps S1 to S8 of the film-forming process in the above-described embodiments is performed twice or more, this cycle is performed so that a C concentration or a N concentration of the film 600 formed in each of at least two of the cycles is different. That is, a laminated film is formed by laminating a plurality of films 600 formed under different process conditions. For example, by increasing the N concentration of the film 600 on the outermost surface (uppermost layer) of the wafer 200, for example, etching resistance to dry etching is improved. Further, by setting the C concentration of the lowermost layer film 600 of the wafer 200 to about 10%, a leakage current is reduced. That is, the laminated film is formed by adjusting the C concentration or the N concentration of each film 600. That is, each film 600 is formed so that the C concentration and the N concentration in each film 600 are different depending on the intended use.

Here, the C concentration of each film 600 may be changed by the following method. For example, the C concentration may be decreased by lowering a partial pressure of the second gas, which is a C-containing gas, increasing the supply amount of the N-containing gas, increasing the time for plasma nitridation (supply of the N-containing gas activated by plasma), increasing the time of oxidation (supply of the O-containing gas), and the like. Further, the C concentration may be increased, for example, by increasing the partial pressure of the second gas, which is the C-containing gas, decreasing the supply amount of the N-containing gas, decreasing the time for plasma nitridation (supply of the N-containing gas activated by plasma), decreasing the time for oxidation (supply of the O-containing gas), and the like.

Figure 9B:
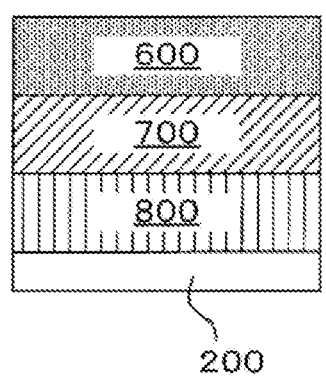
FIG. 9B is a view showing a second example of lamination of silicon oxycarbonitride layers.

FIG. 9B is a view showing a second lamination example. In FIG. 9B, a laminated film is formed by non-simultaneously performing a cycle of steps S1 to S4, S7, and S8 of the film-forming process in the above-described embodiments one or more times to form the film 800, then non-simultaneously performing a cycle of steps S1 to S4 one or more times to form the film 700, and then performing a cycle once or more, the cycle performing steps S1 to S8 non-simultaneously, to form the film 600. That is, a film containing at least a predetermined element, O, C, and N is formed on the wafer 200 by performing a cycle once (second number of times), the cycle non-simultaneously performing a step of forming the film 800 containing the predetermined element, C, O, and N without applying a plasma process applied to the film 600 and a step of forming the film 700 containing C and N and substantially free of O without applying the plasma process applied to the film 600, and then performing a cycle once or more (first number of times), the cycle performing a step of forming the film 600. The film 800 with a high C concentration is formed as a base, which is the lowermost layer of the wafer 200, and the film 600 with a high N concentration is formed on the outermost surface.

The film 700 is formed, for example, by the following steps.

(First gas→Second gas)×n (n is an integer of 1 or more)

The film 800 is formed by, for example, the following step.

(First gas→Second gas→O-containing gas)×n (n is an integer of 1 or more)

The above-mentioned first number of times and second number of times may be different. By adjusting the first number of times and the second number of times, the ratio of C and N contained in the film containing at least the predetermined element, O, C, and N formed on the wafer 200 may be changed. That is, the concentration balance of C and N in the film may be adjusted.

Here, when the SiOCN film is used as a sidewall spacer film of a transistor gate, and when it is used as a laminated film, a thickness of each film is, for example, several Å, and a thickness of the laminated films is 20 to 30 Å. Further, the film thickness of the SiOCN film used when burying a trench or the like is, for example, 50 to 300 Å. In this way, the film thickness of the SiOCN film differs depending on the application. Here, in a case where the film 700 between the film 800 and the film 600 is made too thick, a leakage current may increase. Furthermore, in a case where the film 700 is made too thin, C may be lost during plasma nitridation. Therefore, the film thickness of the film 700 is adjusted so that about 10% of C remains.

A laminated film may be formed by performing, a predetermined number of times: a step of forming the film 800 by performing steps S1 to S4, S7, and S8 of the film-forming process in the above-described embodiments; a step of forming the film 700 by performing steps S1 to S4; and a step of forming the film 600 by performing steps S1 to S8. That is, a film containing at least a predetermined element, O, C, and N may be formed on the wafer 200 by performing a cycle once or more (the third number of times), the cycle non-simultaneously performing the step of forming the film 800, the step of forming the film 700, and the step of forming the film 600.

Here, the third number of times is different from the first number of time described above. By adjusting the first number of times and the third number of times, the ratio of C and N contained in the film containing at least the predetermined element, O, C, and N, which is formed on the wafer 200, may be changed, such that the concentration balance of C and N in the film may be adjusted.

Figure 9C:
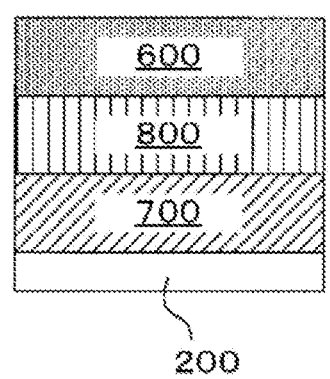
FIG. 9C is a view showing a third example of lamination of silicon oxycarbonitride layers.

FIG. 9C is a view showing a third lamination example. In FIG. 9C, a laminated film is formed by non-simultaneously performing a cycle of steps S1 to S4 of the film-forming process in the above-described embodiments one or more times to form the film 700, then non-simultaneously performing a cycle of steps S1 to S4, S7, and S8 one or more times to form the film 800, and then performing a cycle once or more, the cycle performing steps S1 to S8 non-simultaneously, to form the film 600. That is, a film containing at least a predetermined element, O, C, and N is formed on the wafer 200 by performing a cycle once (second number of times), the cycle non-simultaneously performing a step of forming the film 700 containing C and N and substantially free of O without applying a plasma process applied to the film 600 and a step of forming the film 800 containing the predetermined element, C, O, and N without applying the plasma process applied to the film 600, and then performing a cycle once or more (first number of times), the cycle performing a step of forming the film 600. By forming the O-free film 700 as a base of the lowermost layer of the wafer 200 in this way, for example, in a case where a gate metal exists under the film 700, oxidation of the gate metal may be suppressed.

By adjusting the first number of times and the second number of times, the ratio of C and N contained in the film containing at least the predetermined element, O, C, and N, which is formed on the wafer 200, may be changed, such that the concentration balance of C and N in the film may be adjusted.

A laminated film may be formed by performing, a predetermined number of times: a step of forming the film 700 by performing steps S1 to S4 of the film-forming process in the above-described embodiments; a step of forming the film 800 by performing steps S1 to S4, S7, and S8; and a step of forming the film 600 by performing steps S1 to S8. That is, a film containing at least a predetermined element, O, C, and N may be formed on the wafer 200 by performing a cycle once or more (the third number of times), the cycle non-simultaneously performing the step of forming the film 700, the step of forming the film 800, and the step of forming the film 600 in this order. FIGS. 9B and 9C show a configuration in which the films 600, 700, and 800 are laminated, but a configuration in which the film 600 to which the plasma process is applied and either the film 700 or the film 800 to which the plasma process is not applied are laminated may be adopted. By laminating these two types of films, the concentration balance of C and N in the film may be adjusted. For example, assume that a SiOCN film as a laminated film is to be formed with a first N concentration and a first C concentration as a whole. In this case, the nitrogen concentration of the film formed by applying the plasma process may be set to a second N concentration higher than the first N concentration. In this case, the C concentration of this film may be lower than the first C concentration. On the other hand, the carbon concentration of the film formed without applying the plasma process may be set to a second C concentration higher than the first C concentration. In this case, the N concentration of this film may be lower than the first N concentration. By appropriately combining these films, a film of the desired concentration described above may be obtained as the entire laminated film. By using such a method, for example, it is possible to manufacture, even at a low temperature, a SiOCN film of the same film quality as a SiOCN film formed at a high temperature in terms of dielectric constant, wet etching rate, dry etching resistance, and the like.

Here, the third number of times may be different from the first number of times described above. By adjusting the first number of times and the third number of times, the ratio of C and N contained in the film containing at least the predetermined element, O, C, and N, which is formed on the wafer 200, may be changed, such that the concentration balance of C and N in the film may be adjusted.

Figure 9D:
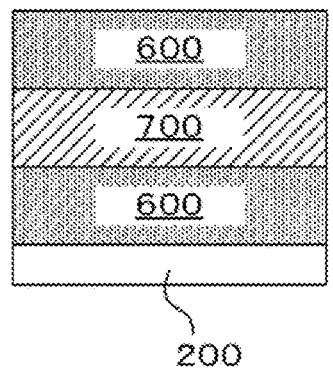
FIG. 9D is a view showing a fourth example of lamination of silicon oxycarbonitride layers.

FIG. 9D is a view showing a fourth lamination example. In FIG. 9D, a laminated film is formed by non-simultaneously performing a cycle of steps S1 to S8 of the film-forming process in the above-described embodiments one or more times to form the film 600, then non-simultaneously performing a cycle of steps S1 to S4 one or more times to form the film 700, and then non-simultaneously performing steps S1 to S8 one or more times to form the film 600. That is, a film containing at least a predetermined element, O, C, and N is formed on the wafer 200 by performing a cycle once (second number of times), the cycle non-simultaneously performing a step of forming the film 600 and a step of forming the film 700, and then performing a cycle once or more (first number of times), the cycle performing a step of forming the film 600. That is, the film 700 of a high C concentration and substantially free of O is formed between the films 600. In other words, a laminated film may be formed so that C concentrations or N concentrations of the film 600 on the outermost surface of the wafer 200 and the film 600 on the lowermost surface of the wafer 200 are different. Further, by forming the film 700 between the films 600, the decrease of C due to plasma may be suppressed, thereby suppressing the decrease in the C concentration of the laminated film. Further, the film 700 may be set to several Å such that it does not affect a k value which is a dielectric constant.

Further, depending on the intended use, the C concentration and N concentration in the lowermost layer film 600 of the wafer 200 and the C concentration and N concentration in the film 600 on the outermost surface of the wafer 200 are made different. By adjusting the first number of times and the second number of times, the ratio of C and N contained in the film containing the predetermined element, O, C, and N, which is formed on the wafer 200, may be changed, such that the concentration balance of C and N in the film may be adjusted.

Further, a laminated film may be formed by performing, a predetermined number of times: a step of performing steps S1 to S8 of the film-forming process in the above-described embodiments to form the film 600; a step of performing steps S1 to S4 to form the film 700; and a step of performing steps S1 to S8 to form the film 600 in this order. That is, a film containing at least a predetermined element, O, C, and N may be formed on the wafer 200 by performing a cycle once or more (third number of times), the cycle non-simultaneously performing a step of forming the film 600, a step of forming the film 700 containing C and N and substantially free of O without applying a plasma process applied to the film 600, and a step of forming the film 600 in this order. Further, the C concentration and N concentration in the film 600 of the lowermost layer of the wafer 200 and the C concentration and N concentration in the film 600 of the uppermost surface of the wafer 200 may be different depending on the intended use.

Figure 9E:
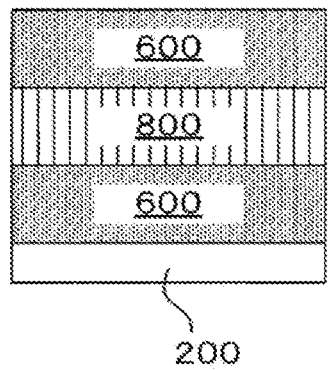
FIG. 9E is a view showing a fifth example of lamination of silicon oxycarbonitride layers.

FIG. 9E is a view showing a fifth lamination example. In FIG. 9E, a laminated film is formed by non-simultaneously performing a cycle of steps S1 to S8 of the film-forming process in the above-described embodiments one or more times to form the film 600, then non-simultaneously performing a cycle of steps S1 to S4, S7, and S8 one or more times to form the film 800, and then non-simultaneously performing a cycle of steps S1 to S8 one or more times to form the film 600. That is, a film containing at least a predetermined element, O, C, and N is formed on the wafer 200 by performing a cycle once (second number of times), the cycle non-simultaneously performing a step of forming the film 600 and a step of forming the film 800 containing a predetermined element, C, O, and N without applying a plasma process applied to the film 600, and then performing a cycle once or more (first number of times), the cycle performing a step of forming the film 600. That is, a laminated film may be formed such that C concentrations or N concentrations of the film 600 on the outermost surface of the wafer 200 and the film 600 on the lowermost surface of the wafer 200 are different. Further, by forming the film 800 between the films 600, C may be replenished, such that the decrease in the C concentration in the laminated film due to the plasma process may be suppressed. In the above-described embodiments, the example in which each step is performed non-simultaneously is described, but as long as the film characteristics are not affected, each step may be performed simultaneously.

By adjusting the first number of times and the second number of times, the ratio of C and N contained in the film containing at least the predetermined element, O, C, and N, which is formed on the wafer 200, may be changed, such that the concentration balance of C and N in the film may be adjusted.

Further, a laminated film may be formed by performing, a predetermined number of times: a step of performing steps S1 to S8 of the film-forming process in the above-described embodiments to form the film 600; a step of performing steps S1 to S4, S7, and S8 to form the film 800; and a step of performing steps S1 to S8 to form the film 600 in this order. That is, a film containing at least a predetermined element, O, C, and N may be formed on the wafer 200 by performing a cycle once or more (third number of times), the cycle non-simultaneously performing a step of forming the film 600, a step of forming the film 800, and a step of forming the film 600.

As described above, according to the present disclosure, the order of formation of each layer, the thickness of each layer, or a combination of layers in the laminated film may be changed depending on the intended use.

Further, the films formed according to the above-described embodiments and modifications may be used when burying a sidewall spacer of a MOS transistor, a recess such as a trench and a groove, etc.

The embodiments, modifications, and lamination examples of the present disclosure are specifically described above, but the present disclosure is not limited to the above-described embodiments, modifications, and lamination examples, but may be changed in various forms without departing from the gist thereof.

According to the present disclosure in some embodiments, it is possible to obtain a desired nitrogen concentration in a film even at a low temperature.

While certain embodiments are described above, these embodiments are presented by way of example, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of processing a substrate, comprising:
   (a) supplying a first gas containing a predetermined element to the substrate;
   (b) supplying a second gas containing carbon and nitrogen to the substrate without activation by plasma;
   (c) supplying a nitrogen-containing gas activated by plasma to the substrate;
   (d) supplying an oxygen-containing gas to the substrate; and
   (e) forming a film containing at least the predetermined element, oxygen, carbon, and nitrogen on the substrate by:
   performing a cycle a first number of times of two or more, the cycle performing (a) to (d) non-simultaneously; or
   performing a cycle once or more, the cycle performing (a) to (d) non-simultaneously in this order.

2. The method of claim 1, further comprising (f) forming a film containing at least the predetermined element, carbon, and nitrogen on the substrate without supplying the nitrogen-containing gas activated by plasma to the substrate,
   wherein the film containing at least the predetermined element, oxygen, carbon, and nitrogen is formed on the substrate by performing a cycle a second number of times of one or more, the cycle performing (e) and (f).

3. The method of claim 2, wherein the first number of times and the second number of times are different.

4. The method of claim 2, wherein a ratio of carbon and nitrogen contained in the film containing at least the predetermined element, oxygen, carbon, and nitrogen is changed by regulating the first number of times and the second number of times.

5. The method of claim 2, further comprising (g) forming a film containing at least the predetermined element, carbon, oxygen, and nitrogen on the substrate without supplying the nitrogen-containing gas activated by plasma to the substrate,
   wherein the film containing at least the predetermined element, oxygen, carbon, and nitrogen is formed on the substrate by performing a cycle a third number of times of one or more, the cycle non-simultaneously performing (e), (f), and (g).

6. The method of claim 5, wherein the first number of times and the third number of times are different.

7. The method of claim 5, a ratio of carbon and nitrogen contained in the film containing at least the predetermined element, oxygen, carbon, and nitrogen is changed by regulating the first number of times and the third number of times.

8. The method of claim 5, wherein (g) is performed after (f).

9. The method of claim 8, wherein (f) is performed after (g).

10. The method of claim 2, wherein (e) is performed after (f).

11. The method of claim 10, wherein in (e), (a) to (d) are performed at least twice or more.

12. The method of claim 2, wherein in (e), (a) to (d) are performed a plurality of times, and (f) is performed between each of the plurality of times of (a) to (d).

13. The method of claim 1, wherein in (e), when the cycle performing (a) to (d) is performed at least twice, concentrations of carbon contained in the films containing the predetermined element, oxygen, carbon, and nitrogen formed in each of at least two of the cycles are different.

14. The method of claim 1, wherein in (e), when the cycle performing (a) to (d) is performed at least twice, concentrations of nitrogen contained in the films containing the predetermined element, oxygen, carbon, and nitrogen formed in each of at least two of the cycles are different.

15. The method of claim 1, wherein the second gas further contains hydrogen.

16. The method of claim 15, wherein the second gas includes at least one selected from a group of an amine-based gas and an organic hydrazine-based gas.

17. A method of manufacturing a semiconductor device, comprising the method of claim 1.

18. The method of claim 1, further comprising (h) purging a space where the substrate is placed between (b) and (c).

19. A substrate processing apparatus comprising:
a process chamber in which a substrate is processed;
a first supply system configured to supply a first gas containing a predetermined element to the substrate in the process chamber;
a second supply system configured to supply a second gas containing carbon and nitrogen to the substrate in the process chamber;
a third supply system configured to supply a nitrogen-containing gas activated by plasma to the substrate in the process chamber;
a fourth supply system configured to supply an oxygen-containing gas to the substrate in the process chamber; and
a controller configured to be capable of controlling the first supply system, the second supply system, the third supply system, and the fourth supply system to perform a process in the process chamber, the process including:
(a) supplying the first gas to the substrate;
(b) supplying the second gas to the substrate without activation by plasma;
(c) supplying the nitrogen-containing gas activated by plasma to the substrate;
(d) supplying the oxygen-containing gas to the substrate; and
(e) forming a film containing at least the predetermined element, oxygen, carbon, and nitrogen on the substrate by:
performing a cycle a first number of times of two or more, the cycle performing (a) to (d) non-simultaneously; or
performing a cycle once or more, the cycle performing (a) to (d) non-simultaneously in this order.

20. A non-transitory computer-readable recording medium
storing a program that causes, by a computer, a substrate processing apparatus to perform a process in a process chamber of the substrate processing apparatus, the process comprising:
(a) supplying a first gas containing a predetermined element to a substrate;
(b) supplying a second gas containing carbon and nitrogen to the substrate without activation by plasma;
(c) supplying a nitrogen-containing gas activated by plasma to the substrate;
(d) supplying an oxygen-containing gas to the substrate; and
(e) forming a film containing at least the predetermined element, oxygen, carbon, and nitrogen on the substrate by:
performing a cycle a first number of times of two or more, the cycle performing (a) to (d) non-simultaneously; or
performing a cycle once or more, the cycle performing (a) to (d) non-simultaneously in this order.

\* \* \* \* \*